United States Patent
Kim et al.

(10) Patent No.: US 6,716,746 B1
(45) Date of Patent: Apr. 6, 2004

(54) SEMICONDUCTOR DEVICE HAVING SELF-ALIGNED CONTACT AND METHOD OF FABRICATING THE SAME

(75) Inventors: In Sung Kim, Seoul (KR); Joon Soo Park, Seoul (KR); Jung Hyeon Lee, Suwon (KR); Hyun Jae Kang, Anyang (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/640,754

(22) Filed: Aug. 18, 2000

(30) Foreign Application Priority Data

Sep. 16, 1999 (KR) .............................. 99-39837

(51) Int. Cl.$^7$ ......................................... H01L 21/4763
(52) U.S. Cl. ...................... 438/637; 438/640; 438/672; 438/675
(58) Field of Search .................. 438/637, 640, 438/672, 675, 618, 253, 586, 595, 639

(56) References Cited

U.S. PATENT DOCUMENTS

| | | | | |
|---|---|---|---|---|
| 5,804,504 A | * | 9/1998 | Choi | 438/637 |
| 5,821,168 A | * | 10/1998 | Jain | 438/692 |
| 5,895,264 A | * | 4/1999 | Teo | 438/632 |
| 6,037,211 A | | 3/2000 | Jeng et al. | |
| 6,136,695 A | * | 10/2000 | Lee et al. | |
| 6,228,755 B1 | * | 5/2001 | Kusumi et al. | 438/618 |

FOREIGN PATENT DOCUMENTS

KR   1994-1273   1/1994

* cited by examiner

Primary Examiner—Hsien Ming Lee
(74) Attorney, Agent, or Firm—Volentine Francos, PLLC

(57) ABSTRACT

A semiconductor device includes a conductive region and line, and a contact plug electrically connecting the line and the region. The line is connected to the region via sidewalls of the plug, and the region is connected to the line via the bottom of the plug. The cross-sectional area of the plug decreases in a direction from an upper to lower portion thereof. In a first method of fabricating a semiconductor device having a self-aligned contact, the plug is formed after the line is formed in an interlayer dielectric layer. Portions of the dielectric layer and line are etched to form a contact hole in which the plug is formed. In a second method, a line having a gap therein is formed in an interlayer dielectric layer. Portions of the dielectric layer, including the gap in the line, are etched to form the contact hole.

13 Claims, 10 Drawing Sheets

SEMICONDUCTOR DEVICE HAVING SELF-ALIGNED CONTACT AND METHOD OF FABRICATING THE SAME

BACKGROUND OF THE INVENTION

1. Field of the Invention

The present invention relates to semiconductor devices and to a method of fabricating semiconductor devices. More particularly, the present invention relates to a semiconductor device having a self-aligned contact and to a method of fabricating the same.

2. Description of the Related Art

In order to fabricate semiconductor devices, several patterns of different materials, for example, a metal film pattern, a semiconductor film pattern, a dielectric film pattern, etc., are formed on a semiconductor substrate in a predetermined order. When forming these patterns on the semiconductor substrate, a mask is formed on one film pattern, i.e., an underlying film pattern, in alignment therewith, and then the overlying pattern is formed by photolithography making use of the mask in order to align the overlying film pattern with the underlying film pattern. However, the more densely integrated semiconductor devices are to become, the smaller the allowable mask alignment margin must become. That is, it is becoming more and more difficult to accurately align overlying film patterns with underlying film patterns. The mask alignment margin, therefore, presents an obstacle in increasing the integration density of semiconductor devices. In fact, if the mask alignment margin is too great, the operating characteristics of the semiconductor devices are denigrated.

One problem which occurs when underlying and overlying film patterns are mis-aligned with each other will now be described in detail with reference to FIGS. 1 and 2.

In the conventional semiconductor device fabrication technique, an interlayer dielectric layer 12 is formed on a semiconductor substrate 10. Then, a contact plug 16, which contacts a junction region 14 of a semiconductor device, for example, a source or drain region, is formed as an underlying film pattern within the interlayer dielectric layer 12. Subsequently, a conductive layer is formed over the region where the contact plug 16 was formed. Then the conductive layer is patterned, using photolithography, to produce a conductive line 18 which represents an overlying pattern with respect to the contact plug 16. The conductive line 18 and the contact plug 16 are often misaligned (see FIG. 1) due to the large margin of error inherent in the photolithography process, whereby the conductive line 18 and the contact plug 16 form a poor contact 20.

When the contact plug 16, which is an underlying film pattern, and the conductive line 18, which is an overlying film pattern, are not accurately aligned, the operating characteristics of the resultant semiconductor device are adversely affected. Specifically, a reduction in the contact area between the contact plug 16 and the conductive line 18 increases the contact resistance, thereby reducing the operating speed of the semiconductor device.

SUMMARY OF THE INVENTION

One object of the present invention is to provide a method of aligning underlying and overlying film patterns with each other within a small alignment margin, whereby the resultant semiconductor device is has a high integration density.

Another object of the present invention is to provide a method of fabricating semiconductor devices which is not affected by the margin of error inherent in the photolithography process.

To achieve these objects, the present invention provides a method of fabricating semiconductor devices, comprising the steps of forming a conductive region on a semiconductor substrate, forming a first interlayer dielectric layer on the entire surface of the semiconductor substrate on which the conductive region has been formed, forming a conductive line on the first interlayer dielectric layer, forming a second interlayer dielectric layer on the conductive line, removing portions of the first interlayer dielectric layer, conductive line, and second interlayer dielectric layer which are formed on the conductive region to thereby form a contact hole which exposes the conductive region, and filling the contact hole with a conductive material to connect the conductive line to the conductive region.

The conductive line may be formed by a Damascene process.

The contact hole may be formed by first forming a photosensitive film pattern on the second interlayer dielectric layer, the pattern defining an opening having a width that is greater than the critical dimension of the conductive line. Then, the conductive line is exposed by etching the second interlayer dielectric layer using the photosensitive film pattern as an etch mask. Thereafter, the contact hole is formed by etching the conductive line and the first interlayer dielectric layer. In some circumstances, the photosensitive film pattern may be removed after the conductive line is exposed.

To achieve the above-mentioned objects, the present invention also provides a method of fabricating semiconductor devices, comprising the steps of forming a conductive region on a semiconductor substrate, forming a first interlayer dielectric layer on the entire surface of the semiconductor substrate on which the conductive region has been formed, forming a conductive line on the first interlayer dielectric layer such that a portion of the conductive line has a gap therein, forming a second interlayer dielectric layer on the conductive line, forming a contact hole by removing a portion of the first interlayer dielectric layer on the conductive region, a first portion of the second interlayer dielectric layer occupying the gap in the conductive line, and a second portion of the second interlayer dielectric layer overlying the gap, and filling the contact hole with a conductive material to connect the conductive line to the conductive region.

The discontinuous conductive line may be formed by a Damascene process.

On the other hand, the contact hole may be formed by first forming a photosensitive film pattern on the second interlayer dielectric layer, the photosensitive pattern defining an opening having respective widths that are greater than the critical dimension and the width of the gap in the conductive line as taken therealong, respectively. Then, the first and second portions of the second interlayer dielectric layer, and a portion of the first interlayer dielectric layer underlying the gap in the conductive line are etched away.

Another object of the present invention is to provide a semiconductor device having a self-aligned contact, and yet also possessing a high integration density.

To achieve this object, the present invention provides a semiconductor device having a conductive region, a conductive line, and a contact plug electrically connecting the conductive line to the conductive region, wherein the conductive line is electrically connected to the conductive region via the sidewalls of the contact plug, the conductive region is electrically connected to the conductive line via the bottom of the contact plug, and the cross-sectional area of the contact plug decreases in a direction extending from the upper portion of the contact plug to the lower portion thereof.

Preferably, the lower portion of the contact plug is self-aligned with the critical dimension of the conductive line. The upper portion of the contact plug is preferably wider than the critical dimension of the conductive line.

The conductive region may be a bit line contact pad, a word line contact pad, a source region, a drain region, a gate electrode, or an interlayer wiring.

The conductive line may be a bit line, a word line, or an interlayer wiring.

BRIEF DESCRIPTION OF THE DRAWINGS

The above and other objects, features and advantage of the present invention will become more apparent by referring to the following detailed description of the preferred embodiments thereof made with reference to the attached drawings, of which.

DETAILED DESCRIPTION OF THE PREFERRED EMBODIMENTS

Figure 1:
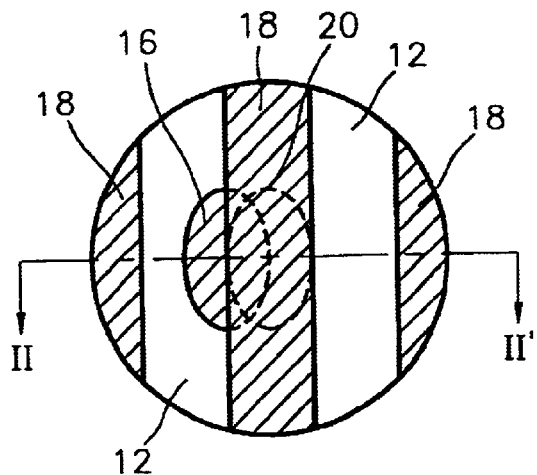
FIG. 1 is a plan view of part of a semiconductor substrate on which an underlying film pattern and an overlying film pattern have been formed by a conventional technique.
Figure 2:
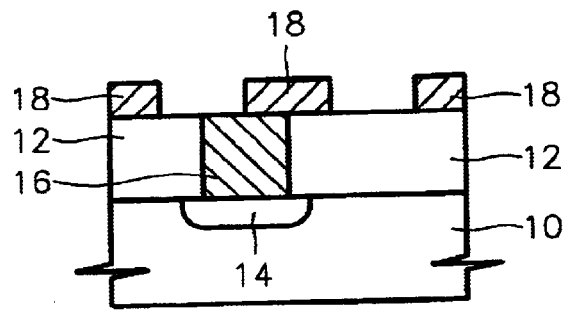
FIG. 2 is a cross-sectional view taken along line II–II' of FIG. 1.

A semiconductor device having a self-aligned contact, and a method of fabricating the same according to the present invention will now be described in detail with reference to the attached drawings. Like reference numerals designate like elements throughout the drawings. However, the thicknesses of layers and/or regions are exaggerated in the drawings for clarity. Also, when a layer is described as being formed "on" another layer or a substrate, the layer can be formed directly on the other layer or the substrate, or other layers can be interposed between the layer being described and the other layer or the substrate. Still further, a spacial coordinate system is shown on the left side of each drawing to facilitate an understanding of the drawings. With regard to the spacial coordinate system, the X axis extends in the width-wise direction of a conductive line, the Y axis extends in the length-wise direction of the conductive line, and the various patterns of the semiconductor device are stacked on the semiconductor substrate in the direction of the Z axis.

A first embodiment of a semiconductor device fabrication method according to the present invention will now be described with reference to FIGS. 3A through 9A. Among these figures, FIGS. 3A, 4A, 5A, 6A, 7A, 8A and 9A are cross-sectional views taken along the X-axis, and FIGS. 3B, 4B, 5B, 6B, 7B, 8B and 9B are cross-sectional views taken along the Y-axis.

Figure 3A:
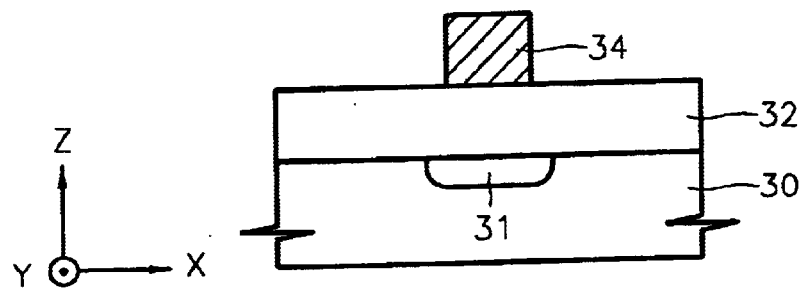
FIG. 3A shows a cross-sectional view along an x-axis of a semiconductor substrate illustrating a step of a first embodiment of a semiconductor device fabrication method.
Figure 3B:
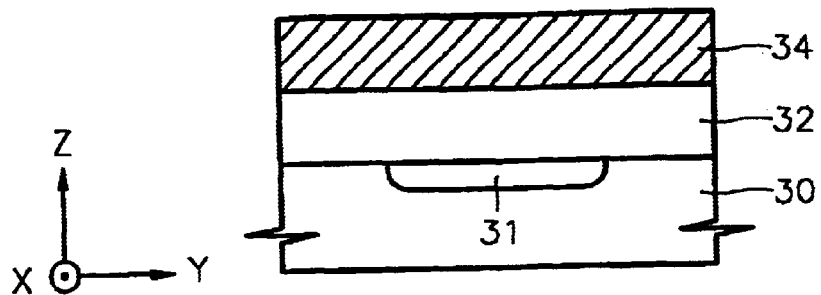
FIG. 3B shows a cross-sectional view along a y-axis of a semiconductor substrate illustrating a step of a first embodiment of a semiconductor device fabrication method.

Referring now to FIGS. 3A and 3B, first, a conductive region 31 is formed in the upper portion of a semiconductor substrate 30. Then, a first interlayer dielectric layer 32 is formed on the semiconductor substrate 30 in which the conductive region 31 has been formed. The conductive region 31 may be an interlayer wiring having a multi-layered wiring structure, a bit line contact pad, a word line contact pad, a m source region, a drain region or a gate electrode. The first interlayer dielectric layer 32 may be a silicon oxide layer, a silicon nitride layer, a silicon oxynitride layer, an undoped silicate glass (USG) layer, a borosilicate glass (BSG) layer, a borophosphosilicate glass (BPSG) layer, a plasma enhanced tetraethylorthosilicate (PE-TEOS) layer, a TEOS layer or an $O_3$-TEOS layer.

Subsequently, a conductive layer is deposited on the first interlayer dielectric layer 32, and then photolithography is performed on the resultant structure, thereby forming a conductive line 34. The conductive line 34 may be an impurity-doped polysilicon film, a copper film, a gold film, an aluminum film, a silver film, a tungsten film or a silicide film. Alternatively, the conductive line 34 may comprise two or more stacked films. For example, the conductive line 34 may be a double layer comprising a tungsten suicide first film and an impurity-doped polysilicon second film.

Figure 4A:
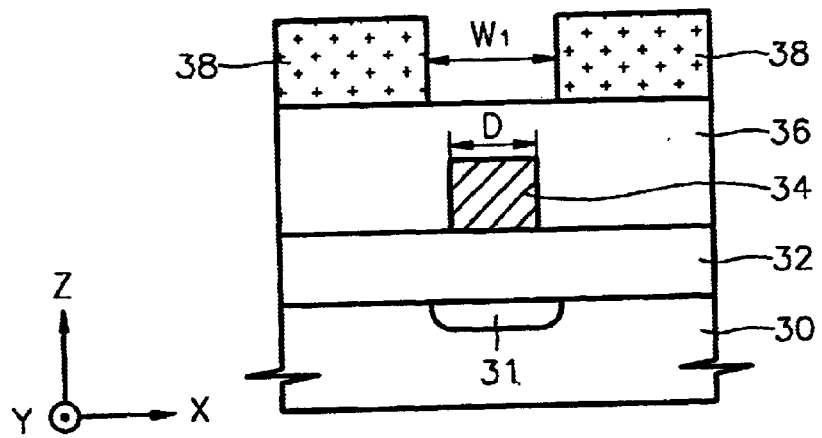
FIG. 4A shows a cross-sectional view along all x-axis of a semiconductor substrate illustrating a subsequent step of a first embodiment of a semiconductor device fabrication method.
Figure 4B:
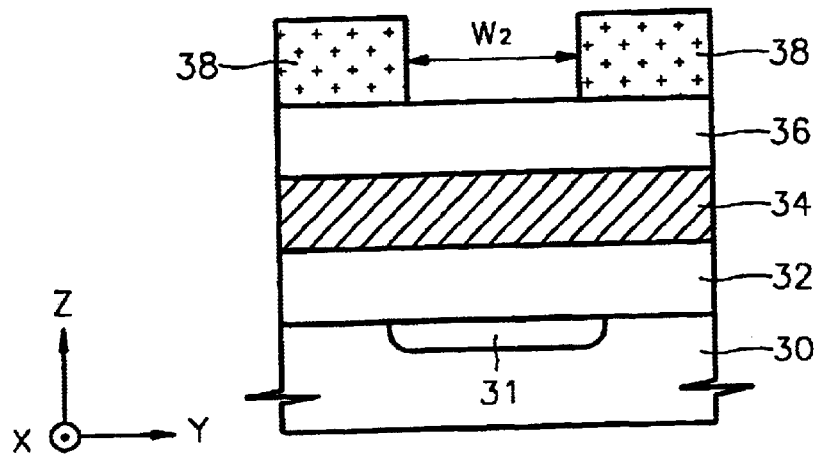
FIG. 4B shows a sectional view along a y-axis of a semiconductor substrate illustrating a subsequent step of a first embodiment of a semiconductor device fabrication method.

Next, referring to FIGS. 4A and 4B, a second interlayer dielectric layer 36 is formed on the entire surface of the semiconductor substrate 30 on which the conductive line 34 has been formed. The second interlayer dielectric layer 36 may be a silicon oxide layer, a silicon nitride layer, a silicon oxynitride layer, a USG layer, a BSG layer, a BPSG layer, a PE-TEOS layer, a TEOS layer or an $O_3$-TEOS layer. If the upper surface of the second interlayer dielectric layer 36 is not flat, the entire surface thereof can be planarized by a method appropriate to the material thereof, e.g., a chemical mechanical polishing (CMP) method, an etch back method, or a thermal reflow method.

Moreover, the conductive line 34 may be formed by a Damascene process. In the Damascene process, a second lower interlayer dielectric layer having a line-shaped opening, which defines a conductive line, is formed on the first interlayer dielectric layer 32. A conductive layer is then formed thereon so as to fill the line-shaped opening, and then is planarized so that the upper surface of the conductive layer is substantially level with the upper surface of the second lower interlayer dielectric layer. Accordingly, the conductive line 34 is formed within the second lower interlayer dielectric layer. Subsequently, a second upper interlayer dielectric layer is formed on the second lower interlayer dielectric layer. The second lower interlayer dielectric layer and the second upper interlayer dielectric layer may be a silicon oxide layer, a silicon nitride layer, a silicon oxynitride layer, a USG layer, a BSG layer, a BPSG layer, a PE-TEOS layer, a TEOS layer or an $O_3$-TEOS layer.

Referring again to FIGS. 4A and 4B, a photosensitive film is formed on the second interlayer dielectric layer 36. The photosensitive film is then patterned so as to form a photosensitive film pattern 38 which exposes the upper surface of the second interlayer dielectric layer 36. More specifically. The photosensitive film pattern 38 defines an opening having a first width $W_1$ as measured along the X-axis and a second width $W_2$ as measured along the Y-axis. The first width $W_1$ can be greater than the critical dimension (D) of the conductive line 34.

Alternatively, an anti-reflection layer (not shown) may be formed on the second interlayer dielectric layer 36 before the photosensitive film 38 is formed thereon. In this case, when the photosensitive film is exposed during photolithography, the anti-reflection layer prevents the exposure light from reflecting at the surface of the conductive line 34 or at the surface of the film pattern formed under the conductive line 34, thereby preserving the profile of the photosensitive film pattern 38.

Figure 5A:
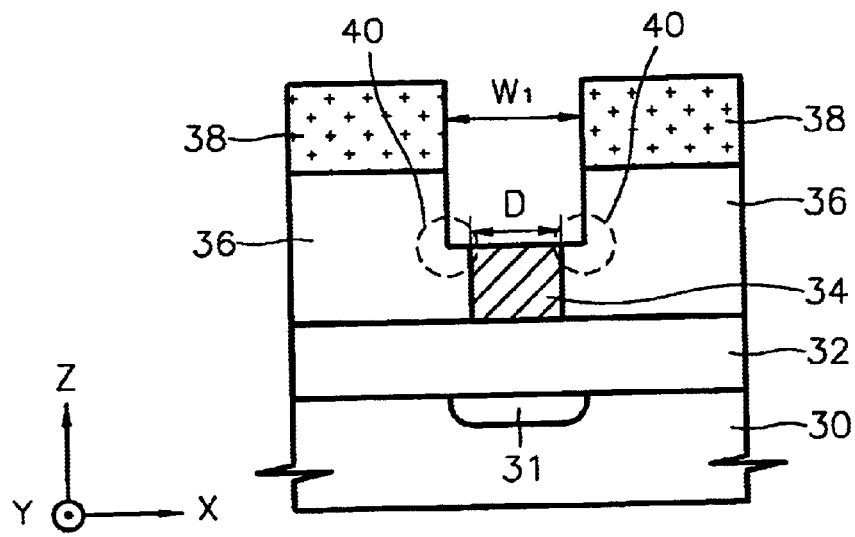
FIG. 5A shows a cross-sectional view along an x-axis of a semiconductor substrate illustrating a subsequent step of a first embodiment of a semiconductor device fabrication method.
Figure 5B:
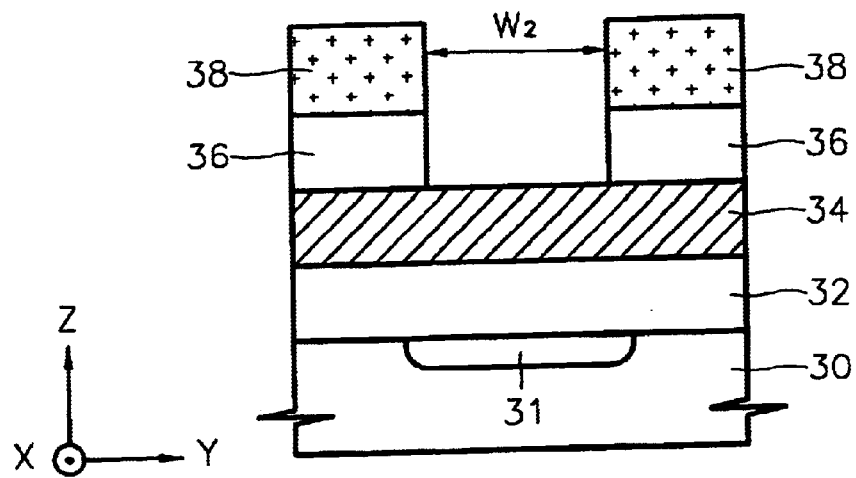
FIG. 5B shows a cross-sectional view along a y-axis of a semiconductor substrate illustrating a subsequent step of a first embodiment of a semiconductor device fabrication method

Referring to FIGS. 5A and 5B, the second interlayer dielectric layer 36 is etched using the photosensitive film pattern 38 as a mask to thus expose the upper surface of the conductive line 34 and portions 40 of the second interlayer dielectric layer on the left and right sides of the conductive line 34. An anisotropic dry etching method, such as a reactive ion etching method, is preferably used to etch the second interlayer dielectric layer 36 and thereby expose the upper surface of the conductive line 34 and portions 40 of the second interlayer dielectric layer.

The etching of the second interlayer dielectric layer 36 preferably stops at the upper surface of the conductive line 34. In this case, the portions 40 of the second interlayer dielectric layer on the left and right sides of the conductive line 34 are exposed, as shown in FIG. 5A, because the first width $W_1$ is larger than the critical dimension D of the conductive line 34. For reasons that will be described in more detail later on, in the first embodiment of the present invention, the finally formed self-aligned contact is to have a width no smaller than the critical dimension D of the conductive line 34.

Figure 6A:
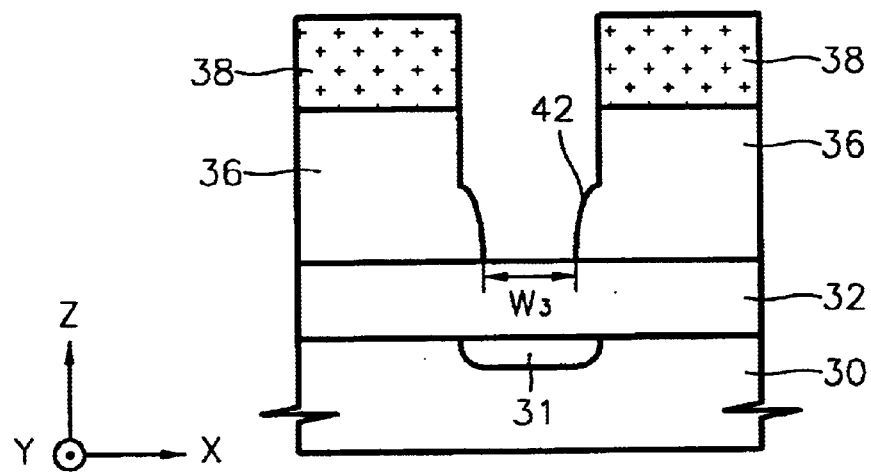
FIG. 6A shows a cross-sectional view along an x-axis of a semiconductor substrate illustrating a subsequent step of a first embodiment of a semiconductor device fabrication method.
Figure 6B:
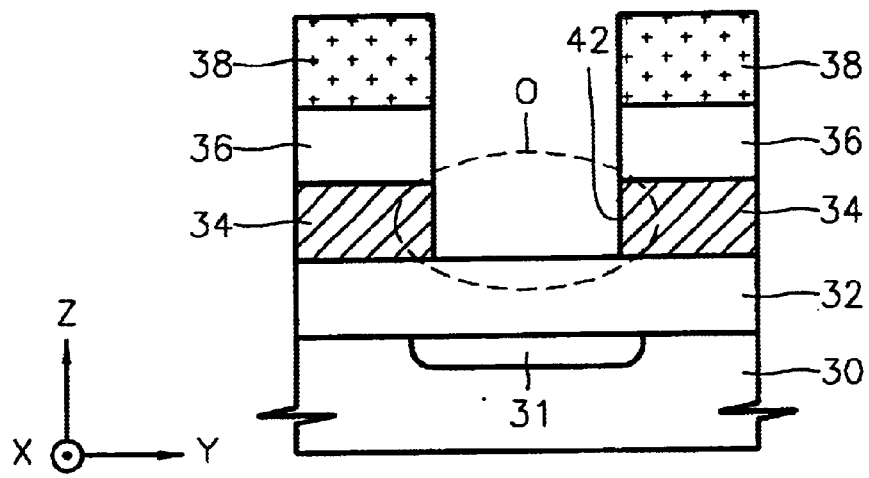
FIG. 6B shows a cross-sectional view along a y-axis of a semiconductor substrate illustrating a subsequent step of a first embodiment of a semiconductor device fabrication method.

Referring to FIGS. 6A and 6B, the conductive line 34 is etched by using the photosensitive film pattern 38 and the second interlayer dielectric layer 36 as masks. An anisotropic dry etching method, such as a reactive ion etching method, is also preferably used for etching the conductive line 34.

The reaction gas for etching the conductive line 34 is preferably capable of etching the conductive line 34 faster than the second interlayer dielectric layer 36. That is, a reaction gas having a large selectivity of the conductive line 34 with respect to the second interlayer dielectric layer 36 is used. Thus, when the conductive line 34 contains polysilicon, a reaction gas containing $CF_4$ or $CF_6$ is used as an etch gas. When the conductive line 34 contains aluminum, a reaction gas containing $BCl_3$, $BCl_3+Cl_2$ $CCl_4+Cl_2+BCl_3$, or $SiCl_4+Cl_2$ is used as the etch gas. When the conductive line 34 contains gold or silver, a reaction gas containing $C_2Cl_2F_2$, $Cl_2$, or $CClF_3$ is used as the etch gas. When the conductive line 34 contains a transfer metal, a reaction gas containing $CF_4+O_2$, $NF_3+H_2$ or $SF_6+O_2$ is used as the etch gas. When the conductive line 34 contains silicide, a reaction gas containing $CF_4+O_2$, $NF_3$, $SF_6+Cl_2$ or $CF_4+Cl_2$ is used as the etch gas. When the conductive line 34 contains tungsten, a reaction gas containing $SF_6$ is used as the etch gas.

A contact hole 42 which exposes the upper surface of the first interlayer dielectric layer 32 over a width $W_3$ is formed by the etching away of the conductive line 34. As the contact hole 42 is being formed, the conductive line 34 and portions 40 (see FIG. 5A) on the left and right sides of the conductive line 34 are being removed such that the sidewalls of the second interlayer dielectric layer 36 become inclined, and the exposure width $W_3$ becomes larger than the critical dimension D of the conductive line 34. However, the upper surface of the first interlayer dielectric layer 32 can be exposed over substantially the same width as the critical dimension D of the conductive line 34 by accurately controlling the etching process conditions. Because the upper surface of the first interlayer dielectric layer 32 is exposed over a width $W_3$ which is greater than or substantially the same as the critical dimension D of the conductive line 34, a gap is formed in the conductive line 34 at the location designated by reference character O in FIG. 6B.

Figure 7A:
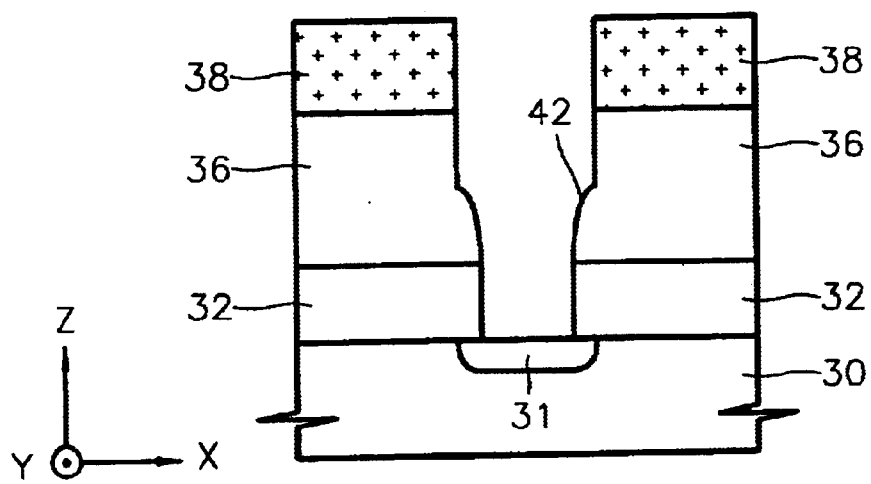
FIG. 7A shows a cross-sectional view along an xi of a semiconductor substrate illustrating a subsequent step of a first embodiment of a semiconductor device fabrication method.
Figure 7B:
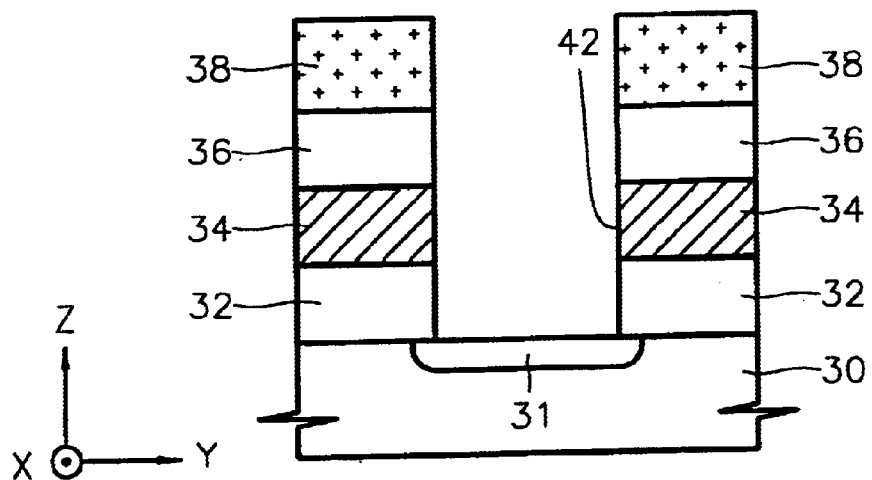
FIG. 7B shows a cross-section view along a y-axis of a semiconductor substrate illustrating a subsequent step of a first embodiment of a semiconductor device fabrication method.

Referring to FIGS. 7A and 7B, the contact hole 42 is extended toward the conductive region 31 by etching the exposed portion of the first interlayer dielectric layer 32 over the width $W_3$. Preferably, the etching is stopped when the contact hole 42 reaches substantially same level as the upper surface of the conductive region 31. The conductive region 31 may be an interlayer wiring having a multilayered wiring structure, a bit line contact pad, a word line contact pad, a source region, a drain region or a gate electrode. An anisotropic dry etching method, such as a reactive ion etching method, is preferably used for etching the first interlayer dielectric layer 32. While the first interlayer dielectric layer 32 is being etched to thereby expose the conductive region 31, the inclined sidewalls of the second interlayer dielectric layer 36 are also etched. Hence, the width of the conductive region 31 being exposed could become greater than the critical dimension D of the conductive line 34. However, even if the exposed area of the conductive region 31 has a width that is greater than the critical dimension D of the conductive line 34, the exposed area of the conductive region 31 is nonetheless self-aligned relative to the critical dimension D of the conductive line 34.

In the method outlined above, the contact hole 42 which exposes the conductive region 31 is formed by several etching processes. However, the contact hole 42 may be formed by a single etching process, in which the second interlayer dielectric layer 36, the conductive line 34, and the first interlayer dielectric layer 32 are together etched using the photosensitive film pattern 38 as an etch mask. Alternatively, the contact hole 42 may be formed as follows. First, the upper surface of the conductive line 34 and the portions 40 (see FIG. 5A) of the second interlayer dielectric layer are exposed by etching the second interlayer dielectric layer 36 using the photosensitive film pattern 38 as a mask. Then the conductive line 34 and the first interlayer dielectric layer 32 are sequentially etched using the portions 40 of the second interlayer dielectric layer as a mask.

Figure 8A:
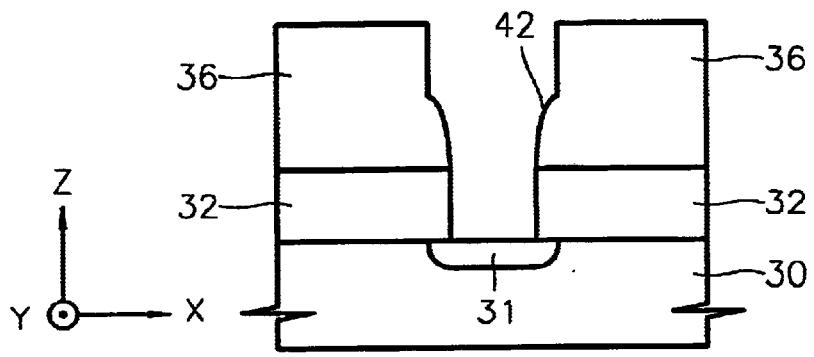
FIG. 8A shows a cross-sectional view along an x-axis of a semiconductor substrate illustrating a subsequent step of a first embodiment of a semiconductor device fabrication method.
Figure 8B:
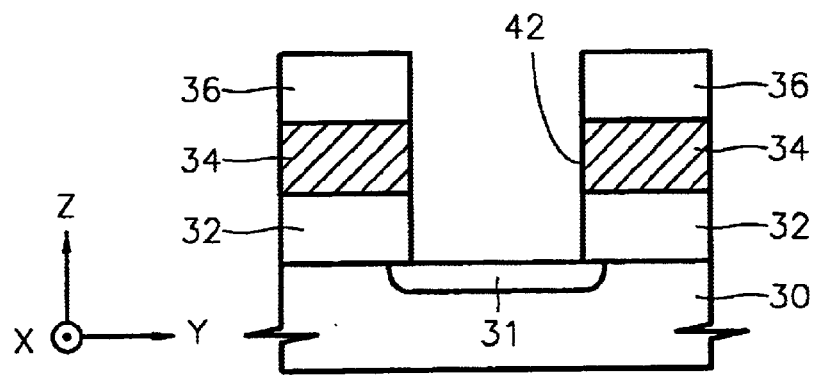
FIG. 8B shows a cross-sectional view along a y-axis of a semiconductor substrate illustrating a subsequent step of a first embodiment of a semiconductor device fabrication method.

Referring now to FIGS. 8A and 8B, the photosensitive film pattern 38 is removed. Moreover, as the contact hole 42 is being formed, the region defining the contact hole 42 may be contaminated by the organic material constituting the photosensitive film pattern 38, or a natural oxide film may form on the conductive region 31. Thus, any such organic material and natural oxide film should be removed before performing the subsequent process steps. In particular, the organic material must be removed since a contact plug 44 (see FIG. 9B) to be formed in the contact hole 42 is intended to be electrically connected to the conductive line 34 via the sidewalls of the contact plug 44. When the organic material exists on the contact interface between the conductive line 34 and the contact plug 44, the operating speed of semiconductor devices may be lowered due to contact resistance created by the organic material. Thus, the inside of the contact hole 42 is preferably cleaned by a dry cleaning method using, for example, $O_2$ plasma.

In this embodiment, the photosensitive film pattern 38 is removed after the contact hole 42 is formed. However, the photosensitive film pattern 38 may be removed immediately after the etching of the second interlayer dielectric layer 36. In this case, the contamination of the contact hole 42 by the organic material constituting the photosensitive film pattern 38 can be prevented. Also, in this case, the second interlayer dielectric layer 36 is preferably formed to such a sufficient thickness that it can exist on the conductive line 34 even after the contact hole 42 is formed. If the second interlayer dielectric layer 36 is not formed to such a sufficient thickness, the second interlayer dielectric layer 36 is etched back to thereby expose the upper surface of the conductive line 34 during the formation of the contact hole 42, in which case the second interlayer dielectric layer can not be used as an etch mask any more.

Figure 9A:
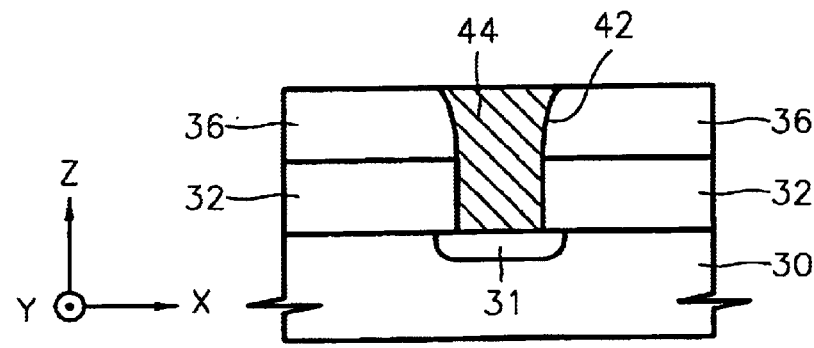
FIG. 9A shows a cross-sectional view along an x-axis of a semiconductor substrate illustrating a subsequent step of a first embodiment of a semiconductor device fabrication method.
Figure 9B:
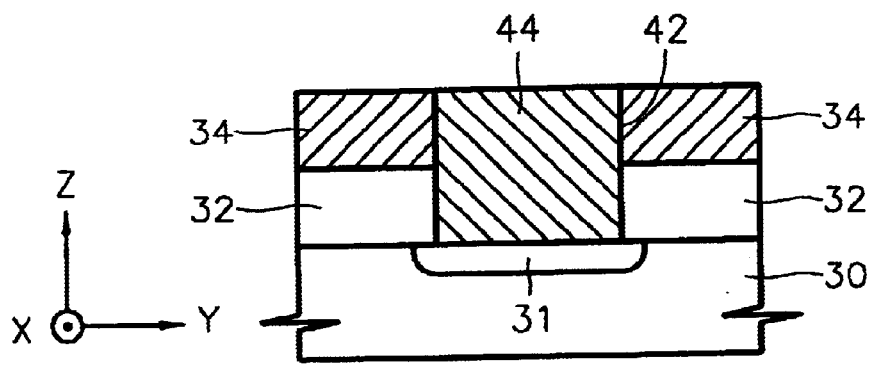
FIG. 9B shows a cross-sectional view along a y-axis of a semiconductor substrate illustrating a subsequent step of a fist embodiment of a semiconductor device fabrication method.

Referring to FIGS. 9A and 9B, a conductive material is deposited in the contact hole 42 and on the second interlayer dielectric layer 36 to form a conductive layer. Here, the inclined sidewalls of the second interlayer dielectric layer 36 provide an improved step coverage of the conductive layer and prevent defects, such as voids, from occurring. Subsequently, the upper surface of the semiconductor substrate on which the conductive layer has been formed is planarized by CMP or an etch back method. The conductive layer can be an aluminum layer, a copper layer, a gold layer, a silver layer, an impurity-doped polysilicon layer, a tungsten layer, a platinum layer, a tungsten silicide layer, a titanium silicide layer or a combination of the above-mentioned layers. Preferably, the planarization stops when the upper surface of the conductive line 34 is reached. The contact plug 44 connecting the conductive line 34 to the conductive region 31 is formed once the upper surface of the conductive line 34 is exposed by the planarization process. The contact plug 44 is thus a self-aligned contact formed between the conductive line 34 and the conductive region 31. Note, before the conductive layer is formed, a barrier metal layer (not shown) may be formed to improve the adhesiveness between the contact plug 44 and the first interlayer dielectric layer 32 and prevent the material constituting the contact plug 44 from being diffused into the first interlayer dielectric layer 32. The barrier metal layer may be a Ti/TiN film. However, the barrier metal layer is not limited to being a Ti/TiN film.

The contact plug 44 formed by the first embodiment of the present invention penetrates the conductive fine 34. On the other hand, the contact plug formed by the conventional technique cannot penetrate the conductive line 34 since it is formed prior to the forming of the conductive line 34. Because the contact plug 44 formed according to the present invention penetrates the conductive line 34, the contact plug 44 and the conductive line 34 are electrically conductively connected via the sidewalls of the contact plug 44.

According to the first embodiment of the present invention, the cross-sectional area of the contact plug taken in the X-Y plane decreases in a direction extending from the upper portion of the contact plug 44 to the lower portion thereof. This is because the upper portion of the contact hole 42 in which the contact plug 44 is to be formed is defined by the photosensitive film pattern, which has a large alignment margin and defines an opening having a width that is greater than the critical dimension of the conductive line 34, while the lower portion of the contact hole 42 has a width that essentially corresponds to the critical dimension of the conductive line 34.

A second embodiment of a semiconductor device fabrication method according to the present invention will now be described in detail with reference to FIGS. 10 through 16. In this embodiment, the steps of forming a conductive region on a semiconductor substrate and of forming a first interlayer dielectric layer on the semiconductor substrate are the same as those in the first embodiment described with reference to FIGS. 3A and 3B.

Figure 10:
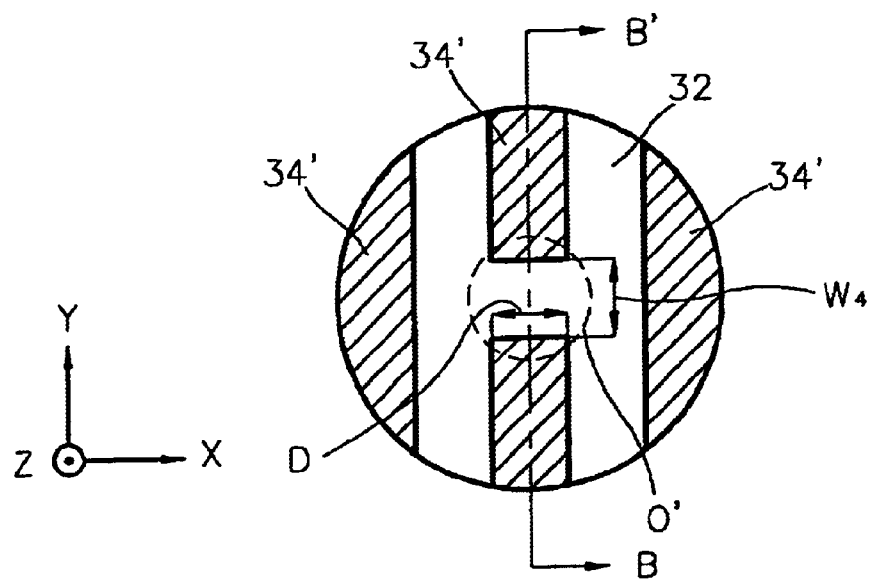
FIG. 10 shows a plan view of a semiconductor substrate illustrating a step of a second embodiment of a semiconductor device fabrication method.

As shown in FIG. 10, a conductive layer is formed by depositing a conductive material on the first interlayer dielectric layer 32. Then, the conductive layer is patterned using photolithography to form a conductive line 34' having a first width D as a critical dimension. Whereas the conductive line 34 produced according to the first embodiment of the present invention is contiguous, the conductive line 34' produced according to the second embodiment is discontinuous so as to define a gap of a width $W_4$, in a region designated by the dashed circle O' However, the conductive line 34' is formed of the same material as that in the first embodiment, and may be formed by the Damascene process described with reference to the first embodiment.

Figure 11:
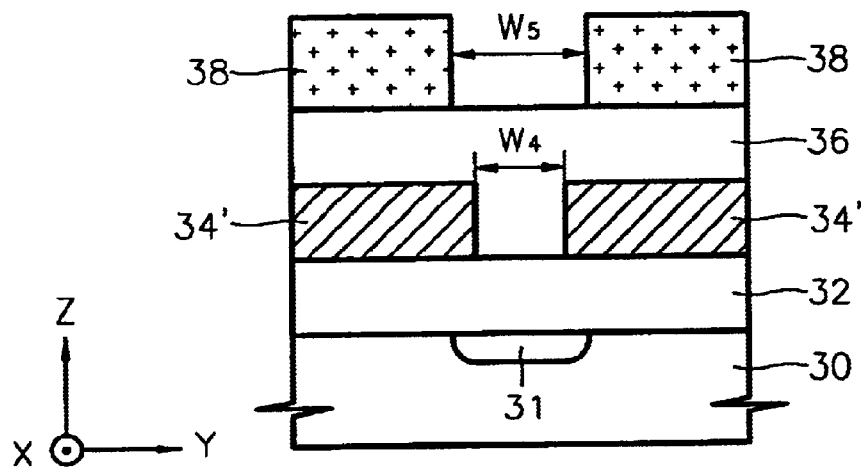
FIG. 11 shows a cross-sectional view along a y-axis of a semiconductor substrate illustrating a subsequent step of a second embodiment of a semiconductor device fabrication method.
Figure 12:
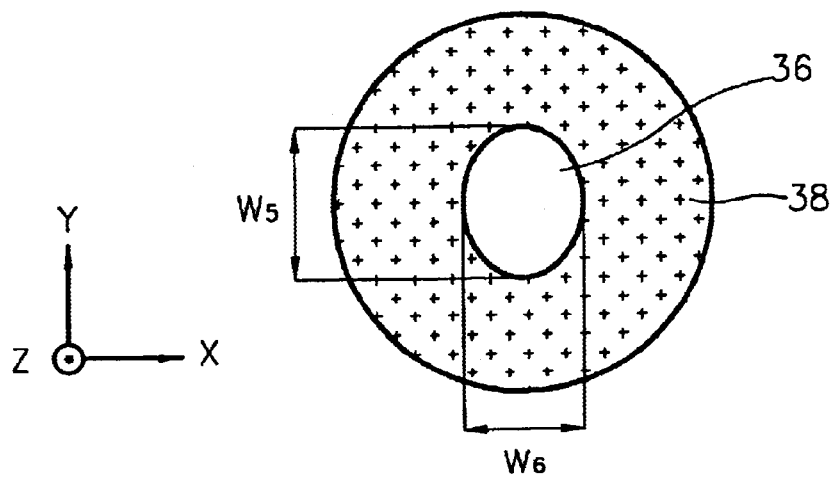
FIG. 12 shows a plan view of a semiconductor substrate illustrating a subsequent step of a second embodiment of a semiconductor device fabrication method.

Referring now to FIGS. 11 and 12, a second interlayer dielectric layer 36 is formed on the conductive line 34' and the first interlayer dielectric layer 32 by the same method used in the first embodiment. Then, a photosensitive film pattern 38 is formed on the second interlayer dielectric layer 36. The width $W_5$ of the opening defined by the photosensitive film pattern 38, in the direction of the Y axis, is greater than the width $W_4$ of the gap in the conductive line 34'. Also, the width $W_6$ of the opening defined by the photosensitive film pattern 38, in the direction of the X axis, is greater than the critical dimension D of the conductive line 34'. The photosensitive film pattern 38 is thus capable of completely exposing the region O' where the gap in the conductive line 34' is formed.

Figure 13:
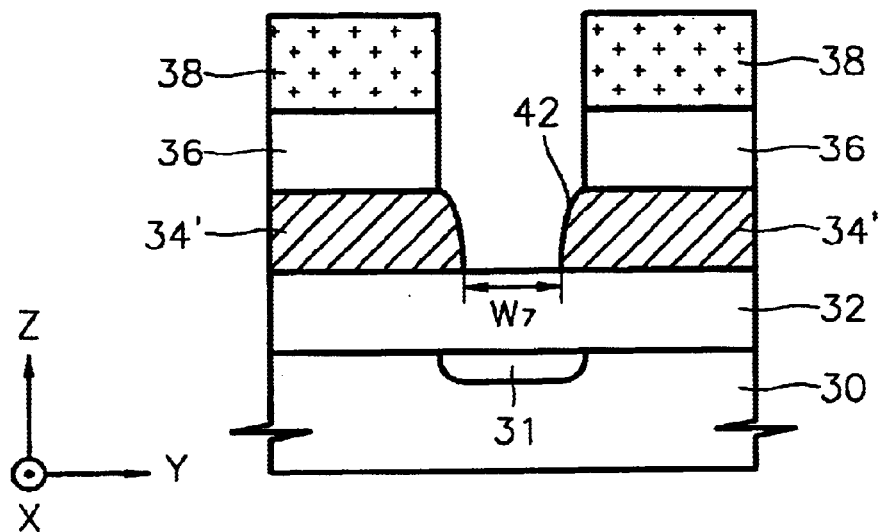
FIG. 13 shows a cross-sectional view along a y-axis of a semiconductor substrate illustrating a subsequent step of a second embodiment of a semiconductor device fabrication method.
Figure 14:
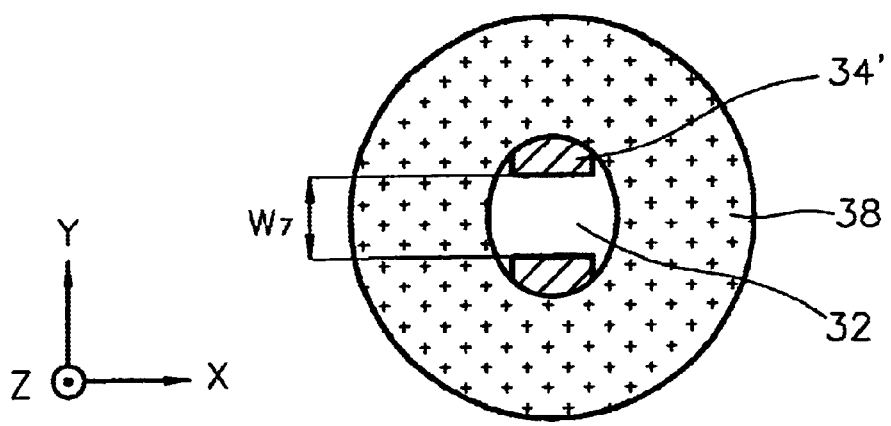
FIG. 14 shows a plan view of a semiconductor substrate illustrating a subsequent stop of a second embodiment of a semiconductor device fabrication method.

Referring now to FIGS. 13 and 14, a contact hole 42 for defining a subsequently produced contact plug 44 (FIG. 16) is formed by a single etching process using the photosensitive film pattern 38 and the conductive line 34' as etch masks. The reaction gas used in this etching process is preferably capable of etching the first and second interlayer dielectric layers 32, 36 faster than the conductive line 34'. Thus, when the first or second interlayer dielectric layer contains silicon oxide, a reaction gas containing $CF_4+H_2$, $C_2F_8$, $C_3F_8$ or $CHF_3$ is used as the etch gas, and when the first or second interlayer dielectric layer contains silicon nitride, a reaction gas containing $CF_4+O_2+H_2$, $C_2F_6$, $C_3F_8$ or $CHF_3$ is used as the etch gas.

In the single etching process of the second embodiment of the present invention, first, the second interlayer dielectric layer 36 is etched. As the process proceeds, the conductive line 34' begins being exposed. Once the conductive line 34' is exposed, the portion of the second interlayer dielectric layer 36 occupying the gap in the conductive line 34' is etched away, whereby the upper surface of the first interlayer dielectric layer 32 is exposed and a contact hole 42 which defines the contact plug begins being formed. Furthermore, the conductive line 34' now serves as an etch mask. At this time, the exposure width $W_7$ of the first interlayer dielectric layer 32 may be greater than the original width of the gap in the conductive line 34', because the portion of the conductive line 34' serving as the etch mask is etched along with the portion of the second interlayer dielectric layer 36 occupying the gap in the conductive line 34'. However, the first interlayer dielectric layer 32 can be exposed over only substantially the same width as the width of the original gap in the conductive line 34' by accurately controlling the etching process conditions. Furthermore, it should be noted that the sidewalls of the conductive line 34' become inclined as the portion of the second interlayer dielectric layer 36 occupying the gap in the conductive line 34' is etched away.

Figure 15:
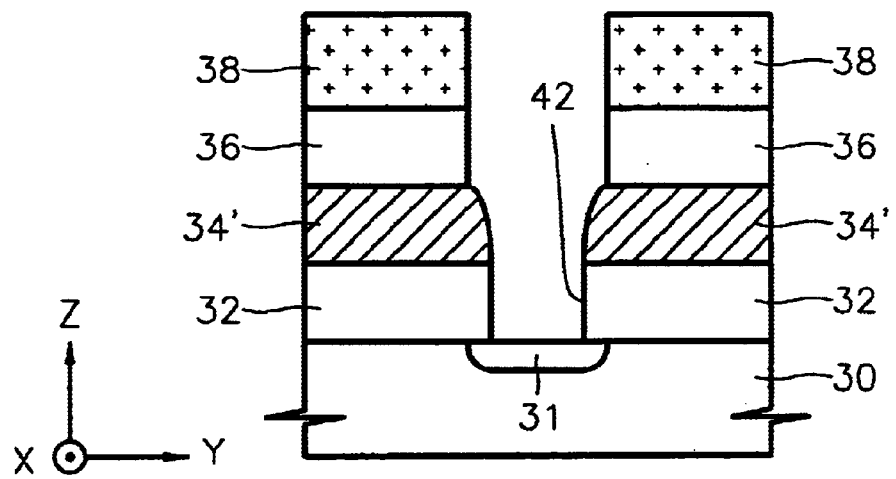
FIG. 15 shows a cross-sectional view along a y-axis of a semiconductor substrate illustrating a subsequent step of a second embodiment of a semiconductor device fabrication method.

Referring to FIG. 15, the region of the first interlayer dielectric layer 32 exposed at the bottom of the contact hole 42 of FIG. 15 is etched using the conductive line 34' as an etch mask. As the first interlayer dielectric layer 32 is etched away, the contact hole 42 is extended toward the conductive region 31. The etching of the first interlayer dielectric layer 32 is stopped when the upper surface of the conductive region 31 is reached. The contact hole 42 for defining the contact plug 44 is completed once the conductive region 31 is exposed.

Figure 16:
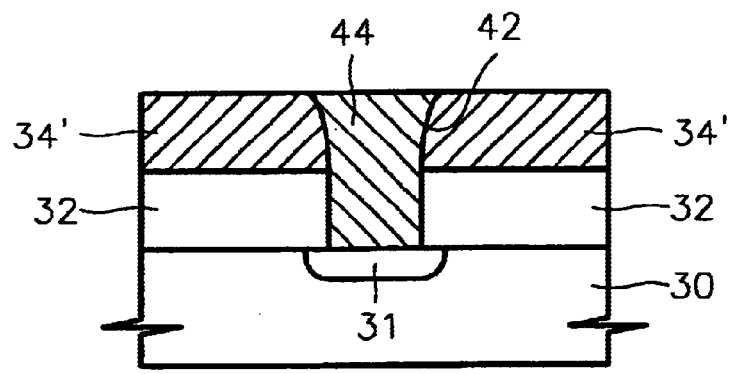
FIG. 16 shows a cross-sectional view along a y-axis of a semiconductor substrate illustrating a subsequent step of a second embodiment of a semiconductor device fabrication method.

Referring now to FIG. 16, the photosensitive film pattern 38 is removed by the same method as that described in connection with the first embodiment, and then the contact hole 42 is cleaned. Thereafter, the contact plug 44 is formed within the contact hole 42. The contact hole 42 in which the contact plug 44 is formed, has inclined sides as in the first embodiment of the present invention. Thus, when the contact hole 42 is filled with a conductive material to form the contact plug 44, the step coverage is excellent.

A self-aligned contact between the conductive region 31 and the conductive line 34' is formed from the bottom portion of the contact plug 44.

Like in the first embodiment, the photosensitive film pattern 38 of FIG. 15 is preferably removed before the contact hole 42 is formed. Thus, the contact hole 42 may be formed by two etching processes instead of the single etching process described above. That is, first, the region of the conductive line 34' where the gap therein is formed is exposed using the photosensitive film pattern 38 as an etch mask. Then, the photosensitive film pattern 38 is removed. Second, the conductive region 31 is exposed using the conductive line 34' as an etch mask. Also like in the first embodiment, the second interlayer dielectric layer 36 is formed to a sufficient thickness in the case in which the photosensitive film pattern 38 is removed before the contact hole 42 is formed.

In the semiconductor device fabrication method according to the present invention, the width of a contact formed between a conductive region and a conductive line is self-aligned by the critical dimension of or the width of a gap in the conductive line. Thus, the degree of alignment provide by the photolithographic process is extremely high, so that the semiconductor device can have a high integration density. Also, the contact hole, in which a contact plug for connecting a conductive region to the conductive line is formed, has inclined sides. Thus, when the contact hole is filled with the conductive material, the step coverage of the conductive material is excellent. As a result, defects such as voids within the contact plug are prevented from occurring.

Although the preferred embodiments of the present invention have been described with reference to FIGS. 3A through 9B and FIGS. 10 through 16, various modifications, which will be apparent to those of ordinary skill in the art, may be made thereto without departing from the true spirit and scope of the invention as defined by the appended claims.

What is claimed is:

1. A method of fabricating a semiconductor device, comprising:

forming a conductive region at a top of a semiconductor substrate;

forming a first interlayer dielectric layer on the semiconductor substrate over the entirety of the conductive region;

forming a conductive line, which is to be connected to the conductive region, on the first interlayer dielectric layer;

forming a second interlayer dielectric layer on the conductive line;

removing portions of the first interlayer dielectric layer, conductive line, and second interlayer dielectric layer which overlie the conductive region to form a contact hole which exposes the conductive region; and filling the contact hole with a conductive material to connect the conductive line to the conductive region, wherein said removing of portions of the first interlayer dielectric layer, conductive line, and second interlayer dielectric layer comprises:

forming a patterned photosensitive film on the second interlayer dielectric layer, the patterned photosensitive film defining an opening therein having a width that is greater than the width of the conductive line, etching the second interlayer dielectric layer using the photosensitive film pattern as an etch mask until the conductive line is exposed, and etching the conductive line and the first interlayer dielectric layer using the etched second interlayer dielectric layer as an etch mask.

2. The method of claim 1, wherein the etching of the conductive line and the first interlayer dielectric layer comprises:

etching the conductive line using the etched second interlayer dielectric layer as an etch mask to expose the first interlayer dielectric layer, and then discretely etching the exposed first interlayer dielectric layer.

3. The method of claim 2, wherein the etching of the second interlayer dielectric layer comprises an anisotropic etching process which produces inclined sidewalls therein, whereby a cross-sectional area of an upper portion of the contact hole is greater than that of a lower portion thereof.

4. The method of claim 2, and further comprising removing the photosensitive film pattern before etching the conductive line.

5. The method of claim 1, wherein the etching of the second interlayer dielectric layer comprises an anisotropic etching process which produces inclined sidewalls therein, whereby a cross-sectional area of an upper portion of the contact hole is greater than that of a lower portion thereof.

6. The method of claim 1, and further comprising removing the photosensitive film pattern before etching the conductive line.

7. A method of fabricating semiconductor devices, comprising:

forming a conductive region at the top of a semiconductor substrate;

forming a first interlayer dielectric layer on the semiconductor substrate over the entirety of the conductive region;

forming a conductive line, which is to be connected to the conductive region, on the first interlayer dielectric layer, the conductive line having a gap therein of a predetermined width;

forming a second interlayer dielectric layer on the conductive line such that a first portion of the second interlayer dielectric layer occupies the gap in the conductive line;

removing a portion of the first interlayer dielectric layer overlying the conductive region, the first portion of the second interlayer dielectric layer occupying the gap in the conductive line, and a second portion of the second interlayer dielectric layer overlying the gap to form a contact hole; and filling the contact hole with a conductive material to connect the conductive line to the conductive region.

8. The method of claim 7, wherein a step of removing portions of the first and second interlayer dielectric layers comprises:

forming a photosensitive film pattern on the second interlayer dielectric layer, the photosensitive film pattern defining an opening therein having widths, in two orthogonal X and Y directions, that are greater than a critical dimension of and the width of the gap in the conductive line, respectively, and etching the second portion of the second interlayer dielectric layer, the first portion of the second interlayer dielectric layer occupying the gap in the conductive line, and a portion of the first interlayer dielectric layer underlying the gap in the conductive line, using the photosensitive film pattern and the conductive line as etch masks.

9. The method of claim 8, wherein the etching of the first and second interlayer dielectric layers comprises:

etching the second portion of the second interlayer dielectric layer using the photosensitive film pattern as an etch mask until a portion of the conductive line defining the gap is exposed, and etching the first portion of the second interlayer dielectric layer occupying the gap in the conductive line, and the portion of the first interlayer dielectric layer underlying the gap, using the etched second interlayer dielectric layer and the portion of the conductive line defining the gap therein as etch masks.

10. The method of claim 9, further comprising removing the photosensitive film pattern after exposing the portion of the conductive line defining the gap therein.

11. The method of claim 9, wherein the etching of the portion of the first portion of the second interlayer dielectric layer occupying the gap in the conductive line comprises an anisotropic etching process which produces inclined sidewalls in the conductive line, whereby a cross-sectional area of an upper portion of the contact hole is greater than that of a lower portion thereof.

12. The method of claim 8, wherein the etching of the portion of the first portion of the second interlayer dielectric layer occupying the gap in the conductive line comprises an anisotropic etching process which produces inclined sidewalls in the conductive line, whereby a cross-sectional area of an upper portion of the contact hole is greater than that of a lower portion thereof.

13. The method of claim 7, wherein the forming of the conductive line comprises:

forming a dielectric film pattern having a line-shaped opening on the first interlayer dielectric layer; and depositing conductive material within the line-shaped opening.

* * * * *